United States Patent

Shahar et al.

[11] Patent Number: 6,124,934
[45] Date of Patent: Sep. 26, 2000

[54] HIGH-ACCURACY HIGH-STABILITY METHOD AND APPARATUS FOR MEASURING DISTANCE FROM SURFACE TO REFERENCE PLANE

[76] Inventors: Arie Shahar; Richard Woods; Nira Schwartz, all of 2800-Plaza Del Amo, Unit 187, Torrance, Calif. 90503-9363

[21] Appl. No.: 09/226,937

[22] Filed: Jan. 8, 1999

[51] Int. Cl.[7] ................................................. G01B 11/00
[52] U.S. Cl. ................ 356/375; 256/559.31; 256/559.38
[58] Field of Search ..................... 356/375, 373, 356/372; 250/559.22, 559.27, 559.31, 559.38

[56] References Cited

U.S. PATENT DOCUMENTS

| | | | |
|---|---|---|---|
| Re. 35,350 | 10/1996 | Shahar et al. | 356/375 |
| 5,298,976 | 3/1994 | Shahar et al. | 356/375 |
| 5,311,288 | 5/1994 | Shahar | 356/375 |

*Primary Examiner*—Hoa Q. Pham
*Attorney, Agent, or Firm*—David Pressman

[57] ABSTRACT

A system for measuring the distance of an examined surface from a reference plane includes two detectors and a radiation source for directing a beam along a path which includes a first focussing lens for focussing the beam as a spot on the surface and reflecting it. A collecting lens converts the reflected radiation to a reflected beam. A splitter directs part of the reflected beam through a second path which includes a second focussing lens for focussing part of the reflected beam onto a surface of the first detector. Its position on the first detector corresponds to the distance of the examined surface under the spot from the reference plane, according to by a first equation with two terms: a first drawback error and a first surface displacement. The other part of the reflected beam propagates through a splitter and along a third path which includes a third focussing lens for focussing the other part of the reflected beam onto a second spot on a surface of the second detector. Its position on the second detector corresponds to the distance of the examined surface from the reference plane according to a second equation with two terms: a second drawback error and a second surface displacement. The second and third focussing lenses cause the first and second equations to be independent. A processing unit utilizes the outputs of the detectors to measure the distance of the examined surface from the reference plane.

36 Claims, 6 Drawing Sheets

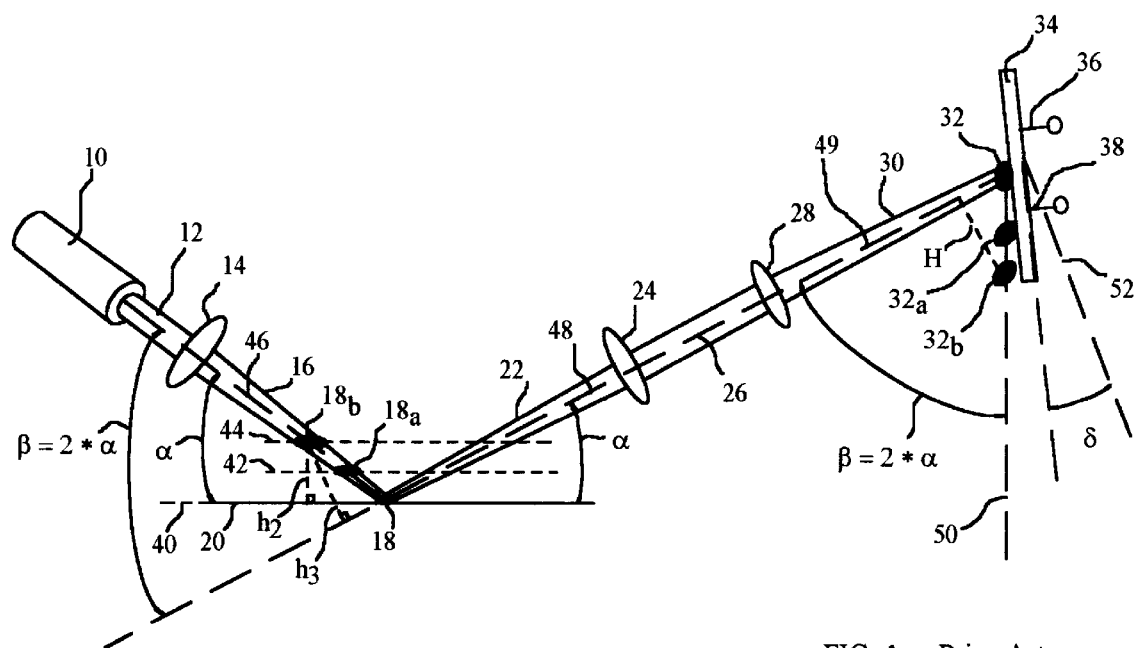
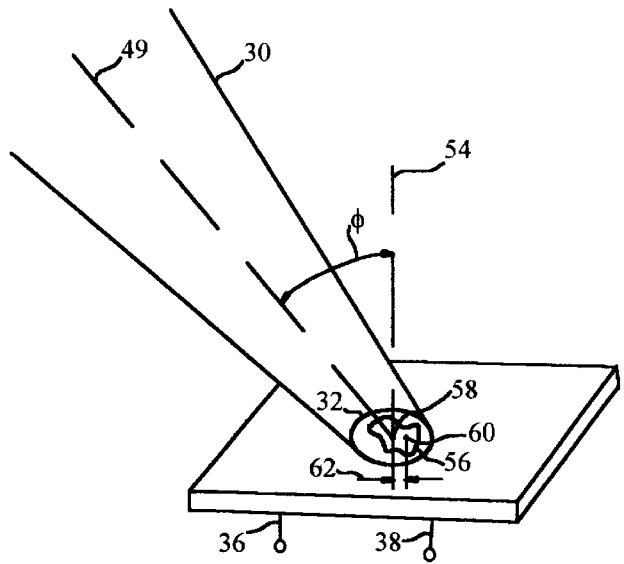
FIG. 1a - Prior Art
FIG. 1b - Prior Art

HIGH-ACCURACY HIGH-STABILITY METHOD AND APPARATUS FOR MEASURING DISTANCE FROM SURFACE TO REFERENCE PLANE

BACKGROUND—FIELD OF THE INVENTION

The present invention relates to a method and apparatus for measuring the distance of a surface from a reference plane. The present measuring system is particularly useful in applications involving measuring the working distance (WD) from a mask pattern on a semiconductor substrate to the objective lens of an inspection machine for maintaining this distance to be equal to the focal length of the objective lens.

BACKGROUND—PRIOR ART

A number of systems are known for measuring the distance of a surface from a reference plane. Such systems are commonly used as autofocus systems to control the WD between a surface and the objective lens of an inspection machine used for examining the surface. This control of the WD is done by maintaining it at a focal length distance from the objective lens. This achieves imaging with optimal resolution for the inspection machine. Adjustment and control of the WD are done according to the measured value of the distance between the examined surface and the reference plane.

One of the earliest and most commonly used systems for distance measurement is known as a triangulation system. According to the triangulation method, a radiation beam is focused into a radiation spot on a surface and is reflected from the surface and is collected by an optical system to project an image of the surface (under the radiation spot) onto a position-sensitive detector (PSD). The position of the image on the PSD is measured by the PSD as the center of gravity of the intensities distributed over the image. The center of gravity of the intensities is a point whose distance from a certain reference point equals the total sum of all the products between the intensity at each point and the distance of that point from the reference point divided by the total sum of all the intensities at those points. When the examined surface is reflective, like a mirror's surface, the center of gravity of the image intensities coincides with the geometrical center of the image. In this situation the image position measured by the PSD is proportional to the distance of the surface from a reference plane.

However, such a method is very sensitive to non-uniform optical properties of the surface, such as reflections, scattering, absorption, phase shifts, polarization, diffraction, and interference. These properties commonly exist in patterned surfaces, such as the wafers used to make integrated circuits (IC). In this situation the distribution of the intensities over the image on the PSD is no longer uniform and the center of gravity of the image intensities no longer coincides with the geometrical center of the image. This results in an error measurement of the image-position, known as drawback error. The drawback error is not constant and depends upon the random geometrical and optical structure of the pattern on the surface. Accordingly the above method cannot be used to accurately measure the distance of a patterned surface from a reference plane.

According to the system described in U.S. Pat. No. 5,311,288, "Method and Apparatus for Detecting Surface Deviations from a Reference Plane" to coinventor Arie Shahar (May 10, 1994), two identical beams are focussed along first and second paths to first and second spots respectively, located at the same position on the examined surface when the surface is located in the reference plane. The first spot is imaged on a common detector via a path which includes the second path, and the second spot is imaged on a common detector via a path which includes the first path. The two images are symmetric to each other and are superimposed on each other, creating a superimposed image. When this image is symmetric with respect to the reference point on the detector corresponding to the location of the reference plane, the superimposed images tend to cancel out local differences in optical properties, resulting in elimination of the drawback error.

The main disadvantage of this system is the need for extremely accurate alignment of the optical system in order to produce a complete overlapping of the first and second radiation spots on the examined surface when it is located at the reference plane. As a result, the system is very sensitive and will not remain stable for a long time.

According to the system described in U.S. Pat. No. Re. 35,350 "Method and Apparatus for Measuring Surface Distance from a Reference Plane" to coinventors Arie Shahar and Nira Schwartz (Oct. 9, 1996), a parallel beam of radiation is directed along first optical path which includes first focussing means for focussing the parallel beam as a spot on the examined surface and reflecting it to provide a reflected beam. As is well known, a parallel beam, also known as a collimated beam, does not diverge appreciably as a function of distance from its source. The reflected beam is converted into a parallel-reflected beam. A part of the parallel reflected beam is directed through a second optical path which includes second focussing means for focussing the spot on a surface of a first detector. The first detector is located such that the position of the spot on the first detector includes both the drawback errors caused by variations in reflectivity, scattering, and/or interference in the examined surface (particularly if it is a patterned surface) and a plane displacement error, representing the distance between the plane of the examined surface and the reference plane. Another part of the parallel reflected beam is directed through a third optical path, including third focussing means, for focussing the spot on a surface of a second detector located such that the position of the spot on the second detector includes only the drawback errors. The outputs of the first and second detectors are utilized to provide a measurement of the distance of the examined surface from the reference plane.

The system of the latter patent is much more stable than the system of the previously cited patent, but it is still has the disadvantage of instability due to the requirement for an accurate alignment, especially for the third path. The third path is specially aligned for projecting an image of a surface of an examined surface under a radiation spot onto a second detector. Due to the alignment of the third path, the position of the image on a second detector is independent of the distance of the examined surface from the reference plane (plane displacement-error) and includes only the drawback error.

OBJECTS AND ADVANTAGES

Accordingly several objects and advantages of the invention are to provide an improved and more stable system for measuring surface distances from a reference plane.

Another object is to provide a method and apparatus for accurately measuring the distance of an examined patterned surface from a reference plane in which the sensitivity to the instability of their optical components is reduced.

Additional objects are to provide such a method and apparatus, which can operate properly for a long time, in spite of some misalignments that might occur in a typical environment, related to the field of the invention.

Further objects and advantages become apparent from a consideration of the description and accompanying drawings.

SUMMARY

In accordance with one of the aspects of the present invention, a system for measuring the distance of an examined surface from a reference plane includes first and second detectors and optical components for directing a radiation beam along first optical path which includes first focussing means for focussing the radiation beam as a spot on the examined surface and reflecting it as reflected radiation. It also includes optical components for collecting and converting the reflected radiation to a reflected beam and an optical component for directing a part of the reflected beam through a second optical path which includes second focussing means for focussing the part of the reflected beam onto a spot on a surface of the first detector. The first detector is located such that the position of the first spot on the first detector corresponds to the distance of the examined surface under the spot from the reference plane and is expressed by a first mathematical equation which includes two terms: the first drawback-error caused by variations in optical properties in the examined surface; and a first surface displacement, representing the distance between the examined surface under the spot and the reference plane. The system also includes optical components for directing another part of the reflected beam through a third optical path which includes third focussing means for focussing the other part of the reflected beam onto a second spot on a surface of the second detector. The second detector is located such that the position of the second spot on the second detector corresponds to the distance of the examined surface under the spot from the reference plane and is expressed by a second mathematical equation which includes two terms: second drawback-error caused by variations in optical properties in the examined surface; and second surface displacement, representing the distance between the examined surface under the spot and the reference plane. The second and third focussing means are arranged to cause the first and second mathematical equations to be independent equations. Finally the system also includes a processing unit for utilizing the outputs of the first and second detectors for providing a measurement of the distance of the examined surface under the radiation spot from the reference plane.

DRAWINGS

FIGS. 1a and 1b diagrammatically illustrate a prior-art system for measuring the distance of an examined surface from a reference plane.

Figure 2A:
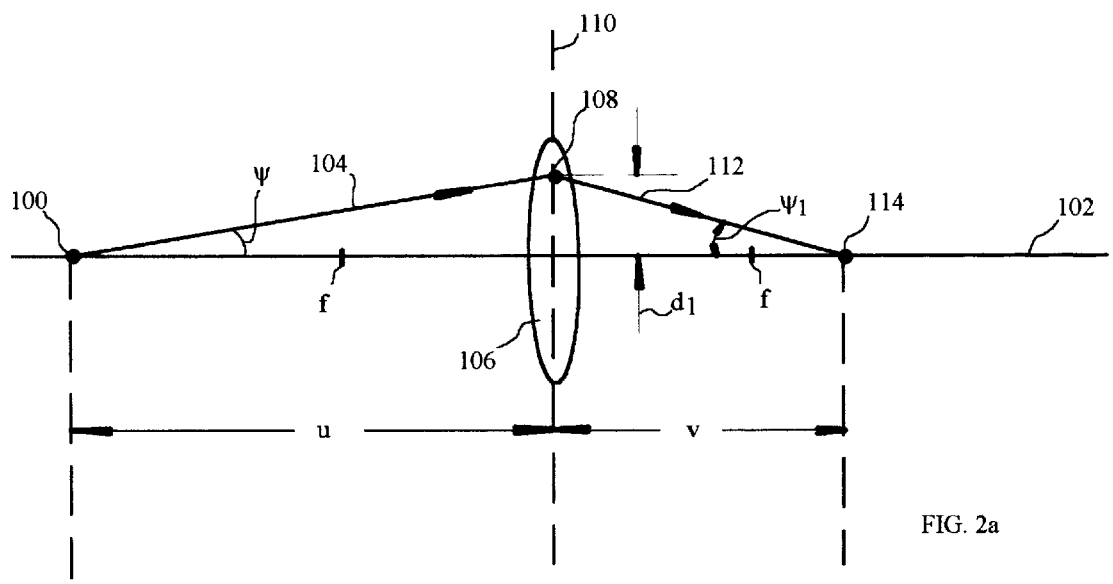
FIGS. 2a and 2b illustrate lenses, some of whose optical properties are implemented in the system of the present invention.

REFERENCE NUMBERS 10 light source
12 radiation beam
14 first focussing lens
16 focused beam
8 focused radiation spot
18a focused radiation spot
18b focused radiation spot
20 examined surface
22 reflected beam
24 first focussing lens
26 parallel reflected beam
28 first projecting lens
30 focused beam
32 focused radiation spot
32a focused radiation spot
32b focused radiation spot
34 PSD
36 electrical output
38 electrical output
40 reference plane
42 first position of surface 20
44 second position of surface 20
46 optical axis
48 optical axis
49 optical axis
50 virtual line image
54 normal to PSD 34
56 radiation spot
58 geometrical center of spot 32
60 center of gravity of spot 56
62 distance between centers 56 and 58
100 point object
102 line passes through point 100
104 ray
106 lens
107 lens
108 point
110 lens plane
112 ray
113 ray
114 image
115 image
116 optical axis
117 lens plane
118 point
200 radiation source
202 parallel beam
204 first focussing lens
206 focussing beam
208 optical axis
210 surface
212 reference plane
214 radiation spot
214a radiation spot
214b radiation spot
216 reflected radiation beam
218 optical axis
219 first collecting lens
220 parallel reflected beam
222 beam splitter
224 parallel beam
226 mirror 228 parallel beam
230 optical axis
232 optical axis
234 first projecting lens
236 focussing beam
238 optical axis
240 first PSD
242 image
242a image
242b image
244 optical axis
246 optical axis
248 second projecting lens
250 focussing beam
252 image
252a image
252b image
254 second PSD
256 PSD output
258 PSD output
260 PSD output
262 PSD output
300 plane
302 electro-optic black box
304 diverging beam
306 second collecting lens
308 optical axis
310 optical beam
312 optical axis
314 second projecting lens
316 optical axis
318 focussing beam
320 optical axis
322 image
322a image
322b image
324 PSD
326 electrical output
328 electrical output
330 virtual line image
400 light source
402 parallel radiation beam
404 first focussing lens
406 focussing beam
408 optical axis
410 radiation spot
410a radiation spot
410b radiation spot
412 examined surface
414 reference plane
416 diverging beam
418 first collecting lens
420 optical axis
422 parallel reflected beam
423 beam splitter
424 parallel beam
426 first projecting lens
438 focussing beam
430 radiation spot
430a radiation spot
430b radiation spot
432 parallel beam
434 mirror
436 parallel beam
438 second projecting lens
440 focussing beam
442 radiation spot 442a radiation spot
442b radiation spot
444 first position of surface 412
446 second position of surface 412
448 virtual line image
450 virtual line image
452 plane
454 plane
456 optical beam
458 optical beam
460 optical opening of box 464
462 optical opening of box 466
464 electro-optic black box
466 electro-optic black box
468 electrical output
470 electrical output
472 electrical output
474 electrical output
476 processing unit
500 radiation source
502 parallel beam
504 optical opening of microscope 506
506 optical microscope
508 objective lens
510 eyepiece lens
512 optical axis
514 mirror
516 parallel beam
518 focussing beam
520 optical axis
522 radiation spot
522a radiation spot
522b radiation spot
524 examined surface
526 reference plane
528 diverging reflected beam
530 parallel reflected beam
532 beam splitter
534 parallel beam
536 lens
538 parallel beam
540 mirror
542 parallel beam
544 lens
546 focussing beam
548 image
548a image
548b image
549 virtual line image
550 optical beam
551 plane
552 optical opening of box 554
554 electro-optic black box
556 electrical output
558 electrical output
560 electrical input
562 electrical input
564 processing unit
566 focussing beam
568 image
568a image
568b image
569 virtual line image
570 optical beam
571 plane
572 optical opening of box 574
574 electro-optic black box 576 electrical output
578 electrical output
580 electrical input
581 plane
582 electrical input
583 plane
584 relative movement between microscope 506 and surface 524
586 translator
588 translator arm
590 arrows along (X,Y) plane
592 arrows along Z axis
594 translator
596 translator arm
598 arrows along (X,Y) plane
600 arrows along Z axis
602 electrical output
604 electrical output
606 electrical input
608 electrical input
610 electrical input
612 electrical input
618 mounting tube
620 mounting component
622 CCD camera
624 electrical lead
626 electrical lead
627 image processing unit
630 electrical lead
632 electrical lead Symbol Definitions Below is a list of symbols for parameters and variables shown in the drawings. These symbols represent multiple and different values. Accordingly some of the symbols are used for different situations in the same drawing or in different drawings and the specific value for each of the situations is clearly determined from where it is used.

$\alpha$—the angle between the optical axis of a first focussing lens and a reference plane.

$\beta$—the angle between the optical axis of a first focussing lens and the optical axis of a first collecting lens. $\beta$ also equals the angle between the optical axis of a first projecting lens virtual line that onto it images are projected by a first projecting lens ($\beta=2\alpha$).

$\gamma$—the angle between a virtual line that images are projected onto it by a first projecting and an optical axis of a collecting lens of "electro-optic black box".

$\gamma 1$—the value of $\gamma$ for a first "electro-optic black box".
$\gamma 2$—the value of $\gamma$ for a second "electro-optic black box".

$\delta$—the rotational angle of a PSD measured between the surface of that PSD and a normal to an optical axis of a projecting lens, which projects an image on that PSD.

$\phi$—the angle between the optical axis of a beam that projects an image on a PSD and a normal to the surface of that detector.

$\Psi$—the angle between a radiation ray and an optical axis of a lens that receives that ray.

$\Psi 1$—the angle between a radiation ray and an optical axis of a lens that projects that ray when that lens is in a first position.

l—the displacement between lenses located at a first and a second position.

$\Psi 2$—the angle between a radiation ray and an optical axis of a lens, which projects that ray when that lens is in its second position, i.e., displaced at amount, l relative to its first position and along a normal to its optical axis.

d—the distance between the optical axis of a lens and a point where a radiation ray is received and also is projected out by that lens.

d1—the value of d for a lens when it is in a first position.

d2—the value of d for a lens when it is in a second position, i.e., displaced at amount, l relative to its first position and along a normal to its optical axis.

f—the focal length of a lens.

$F[C(\gamma 1), K(d1)]$—the operator having parameters ($\gamma 1$) and (d1) for converting the mathematical equation representing a displacement of an image on a PSD into another form.

$F[C(\gamma 2), K(d2)])]$—the operator having parameters ($\gamma 2$) and (d2) for converting the mathematical equation representing a displacement of an image on a PSD into another form.

h—the displacement of an examined surface from a reference plane.

h1—the value of a first displacement of an examined surface from a reference plane.

h2—the value of a second displacement of an examined surface from a reference plane.

h3—the normal distance between the optical axis of a collection lens and the intersection point between the optical axis of a first focussing lens and an examined surface.

H—the displacement of an image measured by a PSD, which equals the normal distance between the optical axis of a first projecting lens and an image that it projects corresponded to a displacement, h between an examined surface and a reference plane.

H1—the value of H for a first detector or for a first "electro-optic black box".

H2—the value of H for a second detector or for a second "electro-optic black box".

PSD—position sensitive detector.
P.U.—processing unit.
U—the distance between an object and a lens plane.
V—the distance between an image produced by a lens and the plane of that lens.

Prior Art—FIG. 1a

The known apparatus illustrated in FIGS. 1a and 1b will first be described to aid in understanding the method and apparatus of the present invention illustrated in FIGS. 2 to 6.

The known apparatus of FIG. 1a includes a light source 10, which emits a parallel radiation beam 12. Beam 12 is converted by first focussing lens 14 into a focussed beam 16 that projects a focused radiation spot 18 on examined surface 20. From surface 20 the light is reflected as reflected beam 22, which is converted by first collecting lens 24 into parallel reflected beam 26. Parallel reflected beam 26 is converted by first projecting lens 28 into a focussed beam 30 that projects a focussed radiation spot 32 (which is actually the image of the examined surface 20 under radiation spot 18) onto PSD 34. PSD 34 measures the position of spot 32 and produces an electrical signal at its outputs 36 and 38 that is proportional to that position. The electrical signal at outputs 36 and 38 is DC signal whose polarity depends upon the position of examined surface 20 relative to reference plane 40.

Radiation spots 18, 18a, and 18b are the radiation spots projected by focussed beam 16 onto examined surface 20 when it is located at different positions. Spot 18 is projected by beam 16 on surface 20 when this surface is located at reference plane 40. Similarly spots 18a and 18b are projected by beam 16 on surface 20 when it is located at its first and second positions illustrated as plane 42 and plane 44, respectively. Radiation spots 18, 18a, and 18b are all distributed along optical axis 46 of lens 14, which is tilted at an angle $\alpha$ with respect to reference plane 40.

Radiation spots 32, 32a, and 32b, which are the images of examined surface 20 under corresponding spots 18, 18a, and 18$b$, are distributed along line 50. Line 50 is a virtual image of optical axis 46 of lens 14 and it indicates the position and orientation where the image of axis 46 would be located if axis 46 were a real object.

Axis 46 is tilted at an angle $\beta=2\cdot\alpha$ with respect to optical axis 48 of first collecting lens 24 or with respect to optical axis 49 of first focussing lens 28. Thus line 50, which is the virtual image of axis 46, is also tilted at an angle $\beta=2\cdot\alpha$ with respect to axis 49. H/h is the ratio between H the distance of an image (such as image 32$b$) from optical axis 49 of lens 28, and h the distance of the corresponding object (such as the surface under spot 18$b$) from reference plane 40. Ratio H/h equals the general expression for the proportional constant between any position displacement H as it is measured by PSD 34 and its corresponding displacement h of examined surface 20 from reference plane 40. The value of h for the second position of examined surface 20 (the normal distance between spot 18$b$ and reference plane 40) is h2.

Thus the distance between spot 18$b$ and reference plane 40 along axis 46 is h2/sin ($\alpha$) and the normal distance h3 between spot 18$b$ and axis 48 or 49 is h2/sin ($\alpha$a)·sin (2·$\alpha$)=2h2cos($\alpha$). Accordingly H/h=2hcos($\alpha$)·M when M is the optical magnification and equals the ratio f3/f1 when f1 and f3 are the focal lengths of lenses 14 and 28, respectively. Accordingly the mathematical expression for H is given by Eq. (1).

$$H=ah \quad \text{(1)}$$

When a =2hcos($\alpha$) M.

The rotational angle $\delta$ of PSD 34 equals the angle between line 52 that is perpendicular to axis 49 and the surface of PSD 34. In FIG. 1, when axis 49 is a common axis of first projecting lens 28 and of beam 30, then angle $\delta$ also equals angle $\phi$ between normal 54 to the surface of PSD 34 and optical axis 49 of lens 28 (as shown in FIG. 1$b$). In this situation Eq. (1) becomes:

$$H=ah/\cos(\delta) \quad \text{Eq. (2)}$$

The system of FIG. 1$a$ operates properly as long as the examined surface has uniform optical properties. When the examined surface is a patterned surface, the system suffers from drawback error, as it is illustrated in FIG. 1$b$.

Prior Art—FIG. 1$b$

FIG. 1$b$ is an enlarged illustration of the relative position between PSD 34, beam 30, axis 49 of lens 28, and image 32 of FIG. 1$a$. When examined surface 20 is a like mirror surface, image 32 is projected at an angle $\phi$ relative to normal 54 and thus has an ellipsoid-like shape with uniform intensity-distribution. In this case the center of gravity of the intensities over image 32 coincides with geometrical center 58 located at the center of ellipsoid 32. When examined surface 20 is patterned, image 32 has a random intensity distribution that is schematically illustrated by spot 56. The center of gravity of the intensities all over spot 56 is shown schematically at point 60, which is different from the geometrical center of ellipsoid 32 located at point 58.

The drawback error, which is the distance difference between center of gravity 60 and geometrical center 58, is schematically illustrated by distance 62. When the circular cross-section of beam 30 has a diameter Q, the small axis and the large axis of the ellipsoid-like shape 32 equal Q and Q/cos ($\phi$)=Q/cos ($\delta$), respectively.

The large axis of ellipsoid 32 is oriented in the direction of the displacement of image 32 that is measured by PSD 34.

It is clear that drawback error 62 is proportional to the size of the large axis of ellipsoid 32. Drawback error E occurs when beam 30 is normal to PSD 34 ($\phi$=0) and then Eq. (2) becomes:

$$H=ah=E \quad \text{Eq. (3)}$$

When $\phi\neq0$ the large axis of ellipsoid 32 is enlarged by a factor of 1/cos ($\phi$)=1/cos ($\delta$) and thus the drawback error is enlarged by the same factor and equals E/cos ($\delta$).

In this case the measured displacement of image 32 is given by:

$$H=ah/\cos(\delta)+E/\cos(\delta)=(H=ah+E)/\cos(\delta) \quad \text{Eq. (4)}$$

Since drawback error E is random, there is no way to predict it. PSD 34 measures the position of image 32 according to Eq. (3). Rotating PSD 34 will convert the position measurement of image 32 according to Eq. (4). Thus any comparison between two position measurements of image 32 that are conducted when PSD 34 is at two different rotational angles $\delta$ will not provide any additional information. Rather such a comparison will produce equations such as Eqs. (3) and (4) which are a set of dependent equations. Eq. (3) and (4) are dependent since they are differ from each other only by a factor of 1/cos ($\delta$).

In this case the position of image 32 on PSD is according to Eq. (3) or Eq. (4). This means that the position of image 32 is according to one equation having two unknowns h and E; thus neither of them can be derived.

However, such known position-detecting systems suffer from the drawback effect when the examined surface includes mask patterns. Other known systems, such as those mentioned above, which are designed to eliminate the drawback error, are sensitive to instability of their optical components.

FIGS. 2$a$ and 2$b$—Properties of Lenses Used in Preferred Embodiment

FIG. 2$a$ illustrates some of the optical properties of a lens, which is used in the present system and is described here to assist in understanding the principle of the invention. A point object 100 located on line 102 emits radiation ray 104 toward lens 106. Ray 104 passes through point 108 on optical axis (or plane) 110 of lens 106. The prime optical axis of lens 106 coincides with line 102 and is at a distance d1 from point 108 on plane (or axis) 110 of lens 106. Distance d1 represents any distance between the optical axis of a lens (such as lens 106) and a point (such as point 108) where a ray is received and also is projected out by that lens. Distance d1 is a value of d for a configuration, such as the configuration illustrated in FIG. 2$a$, and is defined as a first position of lens 106.

Ray 104 is refracted by lens 106 and is projected from point 108 out of lens 106 as ray 112 that propagates toward image 114. Rays 104 and 112 are tilted with angles $\psi$ and $\psi1$, respectively, to the prime optical axis 102 of lens 106, which is aligned along line 102. The relationships between $\psi$ and $\psi1$ are given by a matrix equation:s $$\begin{bmatrix} 1 & 0 \\ -1/f & 1 \end{bmatrix} \begin{bmatrix} d1 \\ \psi \end{bmatrix} = \begin{bmatrix} d1 \\ \psi1 \end{bmatrix} \quad \text{Eq. (5)}$$

In this equation, f is the focal length of lens 106. Equation (5) can also be written as:

$$\psi1=\psi-d1/f \quad \text{Eq. (6)}$$

In a situation when U is the distance of object 100 from plane 110 of lens 106 and V is the distance of image 114 from that plane of lens 106, then $\psi$=d1/U and $\psi1$=d1/V.

Substituting the values of ψ and ψ1 into Eq. (6), rearranging its form, and dividing it by d1 gives the more familiar lens equation:

$$1/U + 1/V = 1/f \qquad \text{Eq. (7)}$$

From Eq. (6) it can be seen that for a given angle ψ, in which an object emits a ray relative to the optical axis of the lens, the angle ψ1, in which the image is projected relative to that axis, can be controlled. Choosing the desired distance d1 from the optical axis of the lens in which the emitted ray hits the lens does the controlling of ψ1.

Figure 2B:
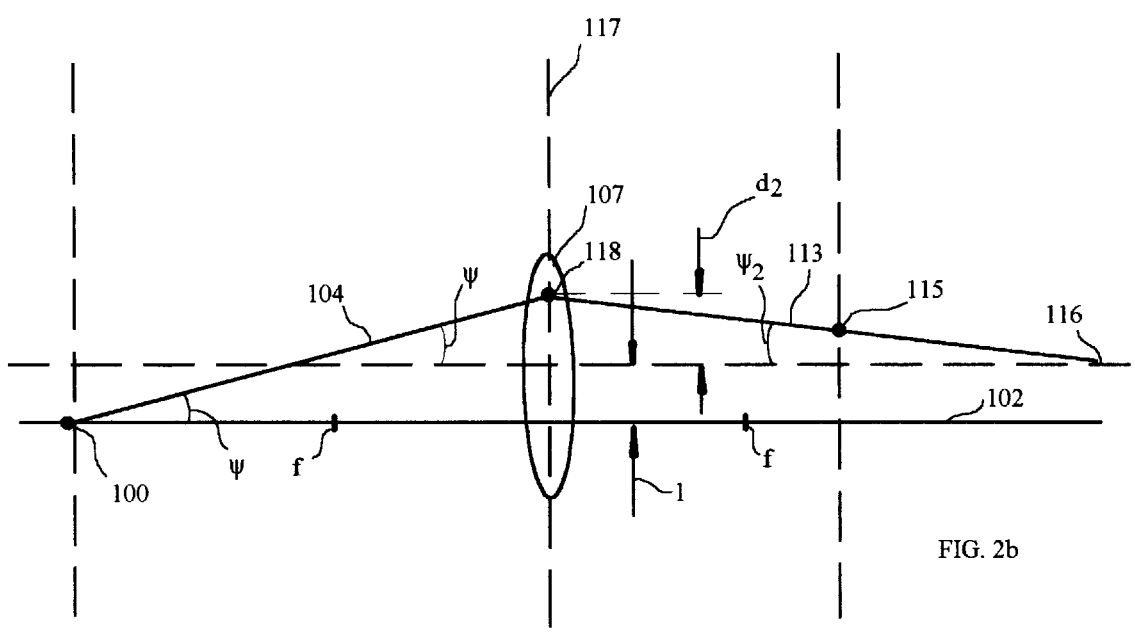

FIG. 2b shows lens 107, which is similar to lens 106 of FIG. 2a, when lens 107 is in a position defined as second position. This means that lens 107 is shifted at distance l relative to line 102. The relative positions of line 102, object 100, and ray 104 that object 100 emits remains unchanged and thus they are the same for the first and second positions. Since axis 116 is parallel to line 102, the angle between ray 104 and axis 116 is also ψ, as it is in FIG. 2a. The new value of d for that second position of lens 107 is d2, defined as the distance between optical axis 116 of lens 107 and point 118 where ray 104 hits plane 117 of lens 107. The mathematical expression for d2 is given by:

$$d2 = d1 - l \qquad \text{Eq. (8)}$$

Ray 113 is reflected out from point 118 at plane 117 of lens 107 and creates an angle ψ2 with axis 116. In this situation the value of ψ2 is given by:

$$\psi 2 = \psi - d2/f = \psi - (d1-l)/f = \psi - d1/f - l/f = \psi 1 - l/f \qquad \text{Eq. (9)}$$

From equation (9) it can be seen that angle ψ2 at which image 115 is projected is reduced relative to ψ1 by l/f.

Different values of the parameter l determine different values of d1 and d2. Parameter l can have any positive or negative value. The specific examples of FIGS. 2a and 2b illustrate the first and second positions l=0 and l>0, respectively.

Varying the values of l, and thus changing distances d1 and d2, controls projecting angles ψ2 and ψ1. The principle of controlling ψ1 and ψ2 by changing their parameters d1 and d2, respectively, is used in the present system as shown in FIG. 3 and explained in the accompanying description.

Figure 3:
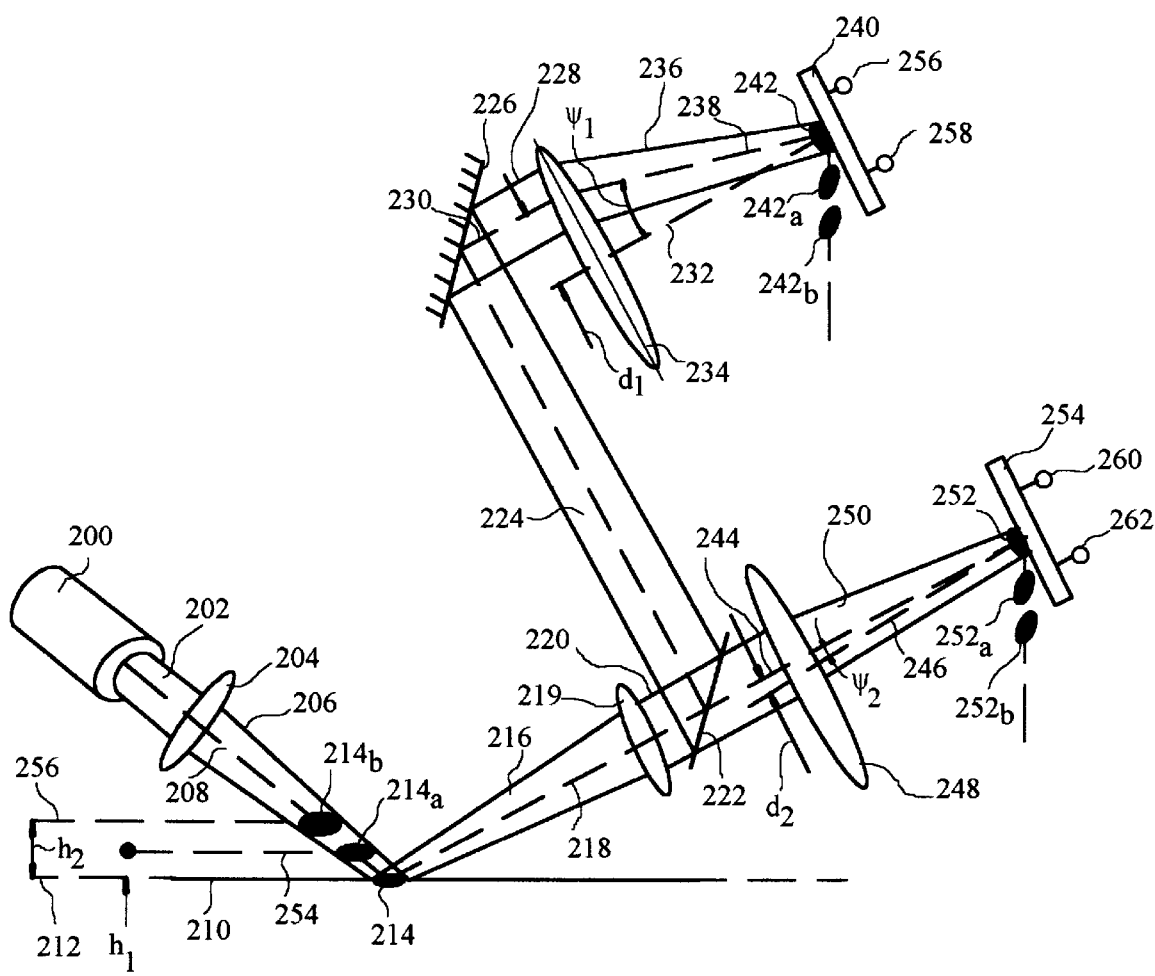
FIG. 3 shows a distance-measurement system according to the present invention.

FIG. 3—Distance Measurement System—First Preferred Embodiment

FIG. 3 schematically illustrates a preferred distance measurement system according to the invention. Radiation source 200 emits parallel beam 202. For example, radiation source 200 can be a light emitting diode (LED), a diode laser, or a gas tube laser. Suitable lasers such as a HeNe gas tube laser or a GaAs diode laser having wavelengths λ of 632.8 and 750 nm, respectively at power of 3 mw are commercially available from Mells Griot, 1770 Kettering St., Irvine, Calif. 92714. Beam 202 is converted by first focussing lens 204 into focussing beam 206 having optical axis 208. Focussing lens 204 and all the other lenses, such as the collecting and the projecting lenses illustrated in the drawings and described below, can have, for example, a numerical aperture (N.A.) in the range between 0.1 to 1 and a focal length f in the range between several millimeters and several meters. Such lenses are also commercially available from Mells Griot. Beam 206 is focused onto surface 210, located at reference plane 212, to produce radiation spot 214.

Beam 206 is reflected from surface 210 as reflected radiation beam 216, having optical axis 218, and is converted by first collecting lens 219 into parallel reflected beam 220.

Part of beam 220 is directed by beam splitter 222 as parallel beam 224 propagating toward mirror 226 and is reflected therefrom as parallel beam 228 having optical axis 230. Optical axis 230 of beam 228 is shifted up at a distance d1 from optical axis 232 of first projecting lens 234 which converts beam 228 into focusing beam 236 having optical axis 238.

As explained in the description of FIG. 2a, d1 is the value of d for a first position of a lens, which in the specific example of FIG. 3 is the position of first projecting lens 234.

Beam 236 is focused onto a first PSD 240 to project image 242 of surface 210 under radiation spot 214. For example, PSD 240 can be a PSD of the type made from a semiconductor and having a surface onto which a radiation spot is projected. Two electrical outputs are connected to the opposite edges of this surface. The position of the center of gravity of the intensities distributed over the radiation spot projected onto the PSD surface is proportional to the difference between the currents I1 and I2 induced by the radiation spot in the PSD outputs. The difference between the currents I1–I2 is normalized by the factor I1+I2 to produce the mathematical expression (I1–I2)/(I1+I2) for deriving the position of the center of gravity of the intensities over the radiation spot, in a way that is independent upon the value of the total intensity of the radiation spot. Such PSDs have a spatial resolution in the range between 0.1 to 100 μm and are suitable for use in the present system. Such PSDs are commercially available from Hamamatsu Corporation, 360 Foothill Road, Bridgewater, N.J. 08807-0910. Image 242 is projected by beam 236 at an angle ψ1 relative to optical axis 232. As explained in the description of the symbols, ψ1 is the projecting angle for a first PSD, which in the specific example of FIG. 3 it is the position of first PSD 240.

The other part of beam 220 passes through beam splitter 222 and has optical axis 244 shifted up a distance d2 from optical axis 246 of second projecting lens 248. Distance d2 is the value of d for a second position of a lens. In FIG. 3 it is the position of second projecting lens 248. Lens 248 converts the part of beam 220 that passes beam splitter 222 into focussing beam 250.

Beam 250 projects image 252 onto second PSD 254 (similar to first PSD 240). Image 252 on PSD 254 and image 242 on PSD 240 are both the images of surface 210 under radiation spot 214 and are proportional in size.

Image 252 is projected by beam 250 onto second PSD 254 at an angle ψ2 relative to optical axis 246 of lens 248. As explained in the description of the symbols, ψ2 is the projecting angle for a second PSD, which in FIG. 3 is the position of second PSD 254.

Radiation spots 214, 214a, and 214b are the radiation spots projected on surface 210 when it is located at different positions at reference plane 212 and at planes 254 and 256 displaced at distances h1 and h2 from reference plane 212, respectively.

As explained before, h1 and h2 are the values of the displacement h for the first and second positions of an examined surface from a reference plane. In the specific example of FIG. 3, they are the distances of planes 254 and 256 from reference plane 212, respectively.

Images 242, 242a, and 242b in the vicinity of first PSD 240, and images 252, 252a, and 252b at the vicinity of second PSD 254, are the images corresponding to surface 210 under radiation spots 214, 214a, and 214b. The relationships between radiation spots 214, 214a, and 214b and their corresponding images 241, 242a, 242b, 252, 252a, and 252b are similar to those which exist between radiation spots 18, 18a, and 18b and their corresponding images 32, 32a, and 32b as previously illustrated for FIG. 1 and as explained in its accompanying description.

According to Eq. (3) the relationships between displacement h of examined surface and positions H measured by a PSD are given by:

$$H = ah + E \qquad \text{Eq. (3)}$$

Since the drawback error E and the displacement h of the examined surface are two unknowns in a single equation (Eq. (3)), it is clear that it is impossible in this situation to derive the value of h from Eq. (3).

Changing the optical magnification M, or changing the orientation (such as angle δ in FIG. 1) of first PSD 240 and/or second PSD 252 affect coefficient a and the drawback error E by exactly the same factor. Accordingly it is clear that the above changes produce dependent equations that do not add any information that can help derive the value of h from Eq. (3). In addition it means that choosing M=1 and δ=0 for purposes of mathematical calculations will not limit or affect the results of the calculations. Accordingly for further analysis the values of M and δ will be taken as 1 and 0, respectively.

To derive the value of h an additional equation is needed which must be independent of Eq. (3).

The first equation in a set of two independent equations used to derived the value of h is related to the position of image 242 on first PSD 240 and is:

$$H1 = a \cdot h + E/\cos(\psi 1) = a \cdot h + E1 \qquad \text{Eq. (10)}$$

H1 is the value of an image displacement H measured by a first PSD. In FIG. 3 it is the displacement of image 242 measured by first PSD 240. E is the drawback error in a situation when the image is projected perpendicular to a PSD (ψ1=0). E1=E/cos (ψ1) is the value of a drawback error E measured by a first PSD when an image is projected onto it at an angle ψ1. Axis 232 is also the normal to PSD 240 and thus ψ1 is also the angle between that normal and projecting beam 236. Accordingly E1 is the drawback error E measured by first PSD 240 when ψ1 is the projection angle of image 242 onto it.

The second equation in the set of the two independent equations is related to displacement position H of an image on a second PSD, which is defined as H2. In the specific example of FIG. 3, H2 is the displacement of image 252 measured by second PSD 254 and it is given by:

$$H2 = a \cdot h + E/\cos(\psi 2) = a \cdot h + E2 \qquad \text{Eq. (11)}$$

E2=E/cos (ψ2) is the value of a drawback error E measured by a second PSD when an image is projected onto it at an angle ψ2. Axis 246 is also the normal to PSD 252 and thus ψ2 is also the angle between that normal and projecting beam 250. Accordingly E2 is the drawback error E measured by second PSD 254 when ψ2 is the projection angle of image 252 onto it.

The general form of Eq. (3) is also valid for Eqs. (10) and (11). In a situation when the ratios between coefficient a and drawback error E are the same for both of the equations (a/E1=a/E2), then Eqs. (10) and (11) are dependent. The parameters that affect coefficient a and drawback error E at the same way in Eqs. (10) and (11) are the optical magnification M and the tilting angle δ (see FIG. 1a) of the PSD.

The way that M and δ affect Eq. (3) (or Eqs. (10) and (11)) is as follows:

$$M \cdot H/\cos(\delta) = M \cdot a \cdot h/\cos(\delta) + M \cdot E/\cos(\delta) \qquad \text{Eq. (12)}$$

Eq. (12) can be divided by M/cos (δ). A result similar to that of Eq. (3) is derived:

$$H = a \cdot h + E \qquad \text{Eq. (12a)}$$

Accordingly it is clear that if Eqs. (10) and (11) differ only in their optical magnification M and rotational angle δ, then they still have the same ratio a/E. This means that Eqs. (10) and (11) are a set of two dependent equations of the type of Eq. (12a).

From the above discussion it is clear that the relationships between Eqs. (10) and (11) are independent of the values of optical magnification M and the rotational angle of the PSD, such as angle δ of FIG. 1.

Accordingly, for the purpose of mathematical calculations only, it can be assumed without any limitations—and regardless of the real values of M and δ—that M=1 and δ=0. (The PSDs are perpendicular to the optical axes of their projecting lens).

Unlike the situation described above for M and δ, the situation regarding E1 and E2 completely differs when ψ1≠ψ2. In a situation when PSDs 240 and 254 are located within the range of the depth of focuses (DOF) of projecting lenses 234 and 248, coefficient a is independent of the projecting angles ψ1 and ψ2 and angles ψ1 and ψ2 affect only drawback error E (without affecting coefficient a). When d1≠d2, then ψ1≠ψ2 and E1≠E2. This leads to a situation when Eqs. (10) and (11) are a set of two independent equations.

An additional equation for deriving the proportional coefficient R between E1 and E2 can be derived experimentally from equations (10) and (11) by measuring drawback errors E1 and E1 for a certain patterned surface located at a known position h.

$$E1 = R \cdot E2 \qquad \text{Eq. (13)}$$

Alternatively the coefficient of proportion R between drawback errors E1 and E2 also can be derived analytically as follows:

Since R is given by:

$$R = E1/E2 \qquad \text{Eq. (14)}$$

which according to Eqs. (10) and (11) gives:

$$R = (E/\cos(\psi 1))/(E/\cos(\psi 2)) = \cos(\psi 2)/\cos(\psi 1) \qquad \text{Eq. (14a)}$$

ψ1 and ψ2 can be calculated from the distances d1 and d2 and thus R can be derived analytically. The coefficient "a" can be derived easily from equation (12a) when the measurement is done on an examined surface which has a mirror-like surface (E=0). Alternatively coefficient a can be calculated from the mathematical expression of Eq. (1).

Eqs. (10), (11), and (13) are a set of three independent equations with three unknowns E1, E2, and, h, which now can be derived for indicating accurately the distance h of the examined surface from the reference plane. The derivation of h is done by a processing unit (P.U.) (not shown) that is fed by outputs 256, 258, 260, and 262 of PSDs 240 and 254.

Stability of System of FIG. 3

All is required for the system of FIG. 3 to operate properly for measuring the distance of an examined surface from a reference plane, even when the examined surface is a patterned surface, is that Eqs. (10) and (11) be independent equations, which means that d1 will differ from d2. When d1 is much greater than d2, the usual misalignments cannot cause d1 to equal d2. In case some misalignments do occur, d1 is still differs from d2 and the system of FIG. 3 can continue to operate properly without the need for realignment of its optical components. All is needed is to do two recalibrations of the system. The first is a calibration of the value of the proportional coefficient R between drawback errors E1 and E2. This calibration is done by a short measurement as explained above.

The second calibration is done electronically for calibrating the value of coefficient a by measuring the new positions of images 242 and 252 corresponding to the situations when the examined surface is mirror-like (E=0) and is located at different distances from the reference plane. It is clear that both of the above calibrations are not associated with any realignment of the optical components of the system of FIG. 3. This makes the above system extremely stable and insensitive to misalignments of it optical components.

Accuracy of Measurement in System of FIG. 3

The value of distance h of examined surface 210 from reference plane 212 is derived from Eqs. (10), (11), and (13) after deriving drawback error E2, which is given by:

$$E2=(H1-H2)/(R-1) \quad \text{Eq. (15)}$$

The maximum error ΔE2 in deriving E2 is given by:

$$\Delta E2=(\Delta H1+\Delta H2)/(R-1) \quad \text{Eq. (16)}$$

ΔH1 and ΔH2 are the measurements errors of H1 and H2. From Eq. (16) it is clear that error ΔE2 goes down with increasing R. A large R will assure a small error ΔE2 and will provide an accurate derivation of the desired value of h with small error Δh. Accordingly, for achieving small Δh it is beneficial to use a large value for distance d1 and a small value for distance d2 for producing a large value of R.

Figure 4:
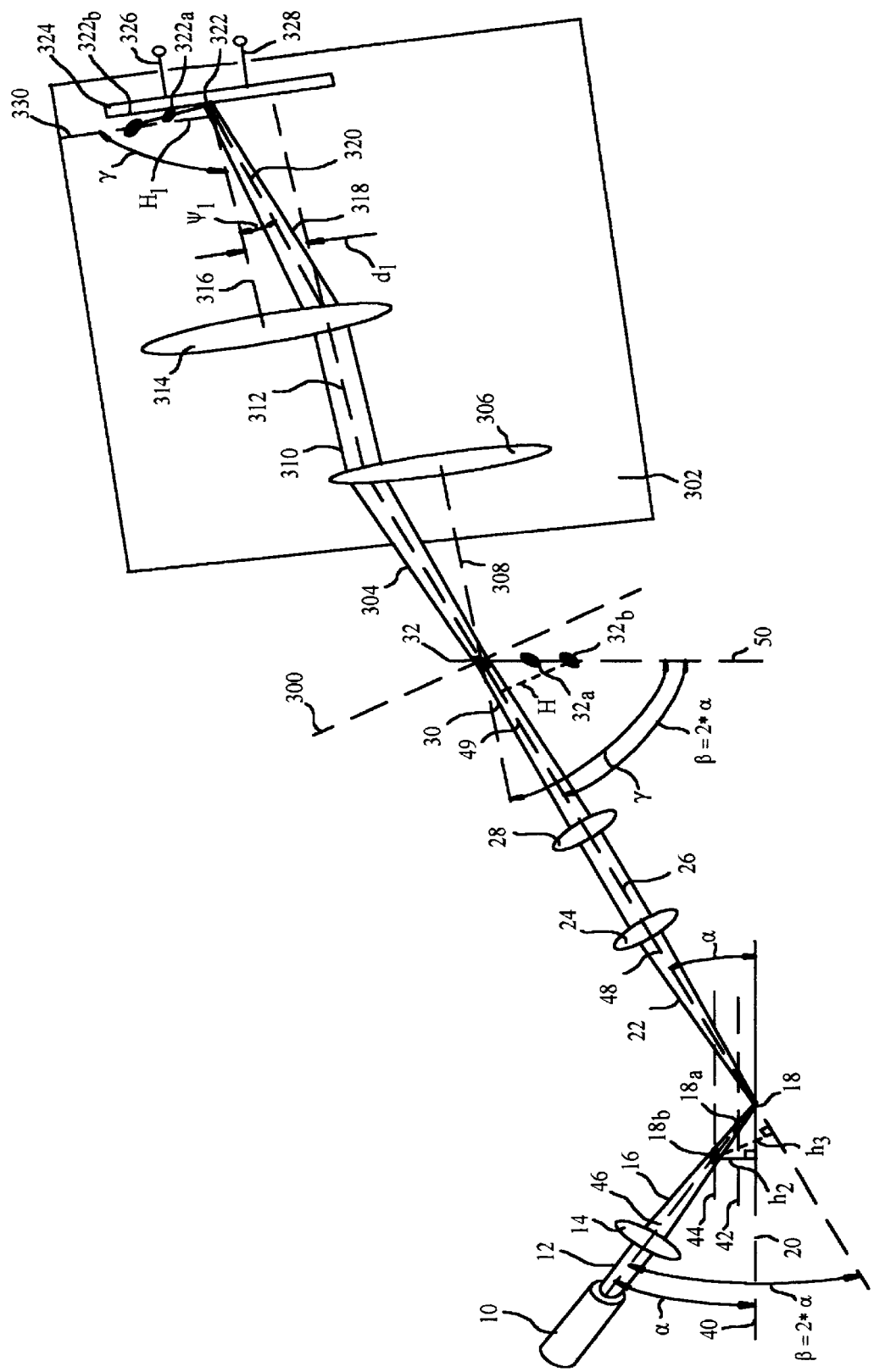
FIG. 4 shows a distance-measurement system including an illustration of the interior components of an "electro-optic black box" operator designed according to the present invention.

FIG. 4—Distance Measurement System Including "Electro—Optic Black Box" Used as Operator FIG. 4 schematically illustrates a system according to the present invention. The system of FIG. 4 includes two parts. The first part on the left is a sub-unit, which is known in the art, and the second part of the system (block 302) is part of the present invention. The first part of the system of FIG. 4 is similar in its structure and functionality to the prior-art system in FIG. 1. Accordingly common numbers (in the group 10 to 50) are used to indicate components and structures which are common to both systems. Plane 300 is where PSD 34 of FIG. 1 was located. However it has been removed from the system of FIG. 4.

Beam 30 is focussed by first projecting lens 28 to project image 32 onto plane 300. From plane 300 beam 30 continues to propagate as diverting beam 304 toward second collecting lens 306 having optical axis 308 that is tilted at an angle γ with respect to virtual line-image 50 along which images 32, 32a, and 32b are located.

Beam 304 is converted by second collecting lens 306 into parallel beam 310 having optical axis 312. Beam 310 propagates toward second projecting lens 314 having optical axis 316, which is displaced from axis 312 at a distance, which was already defined as d. As explained before, d1 is a value of a displacement d between an optical axis of a lens and a point where a beam is collected and reflected by that lens when it is in a first position.

Second projecting lens 314 is located at a position defined as a first position and thus d1 indicates the value for displacement d between axis 316 and axis 312. Beam 310 is converted by lens 314 into focusing beam 318 having optical axis 320, which is tilted at an angle ψ1 with respect to axis 316.

Beam 318 is focused to project image 322 onto first PSD 324 having electrical outputs 326 and 328. Line 330 is a virtual line image of line 50. Line 330 would be a real image if line 50 were a real object. Line 330 is actually the virtual line image of axis 46 and would be a real image if axis 46 were a real object. Line 330 creates, with optical axis 316 of lens 314, the same angle γ that line 50 creates with optical axis 308 of lens 306.

Images 322, 322a, and 322b are located along line 330 and are the images of examined surface 20 under radiation spots 18, 18a, and 18b which correspond to the locations of examined surface 20 at reference plane 40 and planes 42 and 44, respectively.

As explained before, the optical magnification M of a system and the tilting angle (such as angle, δ of FIG. 1) of a PSD do not add any usable information. Thus for the following discussion their values are chosen arbitrarily to be 1 and 0, respectively.

The mathematical relationships between the displacement of examined surface 20 and the displacement of images 32, 32a, and 32b as would be measured by PSD if it were located at plane 300 (such as PSD 34 of FIG. 1 that was removed from the system of FIG. 4) is given by Eqs. (3) and (12a).

$$H=a \cdot h+E$$

The mathematical relationships between the displacement of examined surface 20 and the displacement of images 322, 322a, and 322b as it is measured by PSD 324 without the presence of any drawback error is derived as follows:

The distance s between radiation spots 18b and 18 along axis 46 equals the distance between images 322b and 322 along line 330 and is given by:

$$s=h/\sin(\alpha) \quad \text{Eq. (17)}$$

Then H1, which it is the image-displacement measured by first PSD 324, equals the distance of image 322b from optical axis 316 and is given by:

$$H1=s \cdot \sin(\gamma)=h \cdot \sin(\gamma)/\sin(\alpha) \quad \text{Eq. (18)}$$

Since angle γ differs from angle β=2·a, it is clear that H1≠H when H is the image-displacement that would be measured by a PSD if a PSD like PSD 34 of FIG. 1 were placed at plane 300. The ratio C between H1 and H is given by:

$$C=H1/H=\sin(\gamma)/\sin(2 \cdot \alpha) \quad \text{Eq. (19)}$$

Or $$H1=C \cdot H=C \cdot a \cdot h \quad \text{Eq. (19a)}$$

When examined surface 20 is a patterned surface, then a drawback error E1 that is measured by a first PSD is given, according to the above and as explained by:

$$E1=E/\cos(\psi 1) \quad \text{Eq. (20)}$$

Here E is the drawback error and exists at line 300 and ψ1 is the angle that images such as images 322, 322a, or 322b are projected onto a first PSD, such as PSD 324, by focussing (projecting) beam 318. In another form:

$$E1 = K \cdot E \qquad \text{Eq. (20a)}$$

when K equals:

$$K = 1/\cos(\psi 1) \qquad \text{Eq. (20b)}$$

Thus the mathematical relationships between displacement h of examined surface 20 and displacement H1 of images 322, 322a, and 322b as it is measured by PSD 324 with the presence of any drawback error is:

$$H1 = C \cdot a \cdot h + K \cdot E \qquad \text{Eq. (21)}$$

Here h is the displacement between examined surface 20 corresponding to displacement H of images 32, 32a, and 32b as would be measured by PSD if such PSD were located at plane 300 (such as PSD 34 of FIG. 1 that was removed from the system of FIG. 4). It is assumed that the mathematical relationships between h and H are:

$$H = a \cdot h + E \qquad \text{Eq. (3)}$$

Since $\sin(\gamma)/\sin(2 \cdot a)$ is different from $1/\cos(\psi 1)$ then $C \neq K$ and thus Eqs. (21) and (3) are independent of each other.

Accordingly the part of the system of FIG. 4 that is confined in schematic block 302 can be treated as an "electro-optic black box" 302, although its components and their operation are fully detailed. This black box receives images, such as images 32, 32a, and 32b, and produces electrical signals at its outputs 326 and 328 which are proportional to the positions of images such as 322, 322a, and 322b. This means that such a black box converts the displacement of an image corresponding to a displacement of an examined surface relative to a reference plane in the from $H = a \cdot h + E$ (as it would be measured by a PSD if such PSD were located along line 50) to the form $H1 = C \cdot a \cdot h + K \cdot E$ (as it is measured by PSD 324) when $C \neq K$.

Black box 302 affects only coefficient "a" by a factor C and also affects only drawback error E by a factor K when $C(\gamma) \neq K(\psi 1)$. The separate influences of black box 302 on coefficient a and drawback error E are due to the following:

Drawback error E depends only upon projecting angle $\psi 1$ and is independent of displacement values h (provided that the pattern of examined surface 20 remains unchanged for the different values of h).

Assume that the optical magnification M=1 and the rotational angle δ (such as that shown in FIG. 1) of PSD 324 equals zero. In such a situation and according to the depth of focuses (DOF) definition, coefficient a depends only upon the geometrical structure of the system, i.e., angle γ. It is independent of projecting angle $\psi 1$ as long as PSD 324 is located within the range of DOF of second projecting lens 314.

Accordingly black box 302 can treated as an example general black box that serves as a general operator to produce independent equations. The factor C depends only upon the angle γ (when α is fixed) and the factor K depend only upon angle $\psi 1$. The operational function of this operator is symbolized as $F[C(\gamma), K(\psi 1)]$ and is defined as operating on equation $H = a n \cdot h + E$ to create a new independent equation $H1 = C \cdot a \cdot h + K \cdot E$ when $C(\gamma)$ and $K(\psi 1)$ are defined according to Eqs. (19) and (20b). Since, according to Eq. (6), angle $\psi 1$ depends upon distance d (d=d1 in this specific example) between axis 316 and axis 318, then K is also a function of, d1, and K(d1). Thus the operational function F $[C(\gamma), K(\psi 1)]$ becomes $F[C(\gamma), K(d1)]$.

Figure 5:
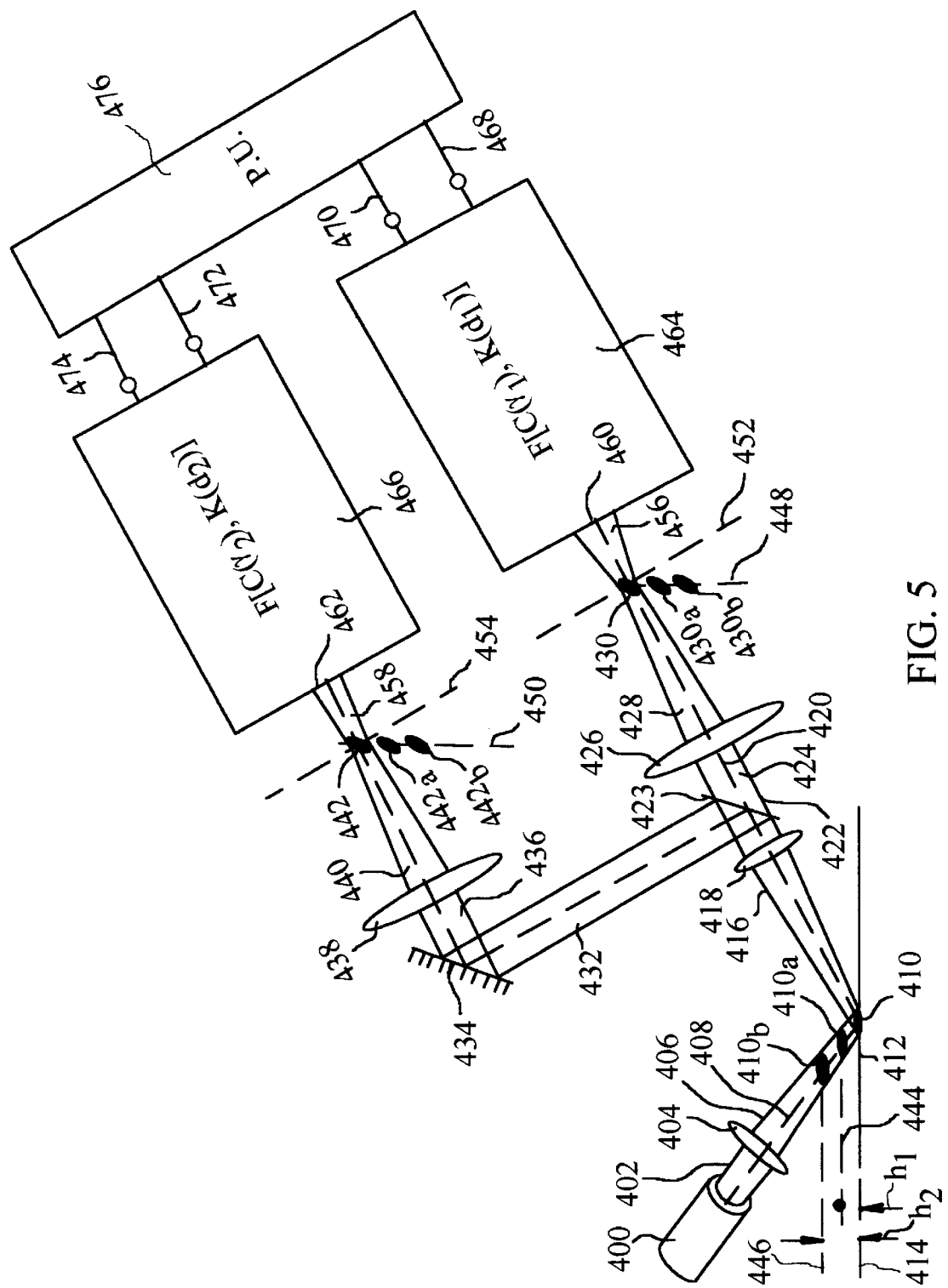
FIG. 5 illustrates a distance measurement-system according to the present invention, including two "electro-optic black box" operators.

FIG. 5—Distance Measurement System Including Two Black Box Operators for Producing Independent Equations in Present System—Second Preferred Embodiment FIG. 5 shows a different system according to the present invention. FIG. 5 illustrates the use of two black box operators of the type whose operational principle is illustrated in FIG. 4. A light source 400 emits a parallel radiation beam 402, which is converted by a first focussing lens 404 into focusing beam 406 having optical axis 408 that coincides with the optical axis of lens 404.

Beam 406 is focussed into radiation spot 410 on examined surface 412 located at reference plane 414. Beam 406 is reflected from examined surface 412 as diverging beam 416 and is converted by first collecting lens 418, having optical axis 420, into parallel-reflected beam 422. Part of parallel-reflected beam 422 passes through beam splitter 423 as parallel beam 424 and is converted by second focussing (or first projecting) lens 426 into focussing beam 428.

Beam 428 is focused to project radiation spot 430, which is the image of examined surface 412 under spot 410. The other part of parallel beam 422 is reflected by beam splitter 423 as parallel beam 432, which is reflected again by mirror 434 as parallel beam 436. Beam 436 is converted by second focussing (or second projecting) lens 438 into focussing beam 440. Beam 440 is focused to project radiation spot 442, which is the image of examined surface 412 under spot 410.

The values of displacement h of examined surface 412 from reference plane 414 when it is located at first and second position corresponding to planes 444 and 446 are h1 and h2. When examined surface 412 is located at planes 444 and 446, then beam 408 is focused on examined surface 412 into radiation spots 410a and 410b, respectively. Examined surface 412 under radiation spots 410, 410a, and 410b serves as an object for the imaging system of lenses 418, 426, and 438 for producing their corresponding images 430, 430a, 430b, 442, 442a, and 442b distributed along virtual line-images 448 and 450. Virtual line-images 448 and 450 are the virtual images of optical axis 408 similar to virtual line-image 50 of FIG. 4. They would be real images if axis 408 were a real object.

Plane 452 is located at a distance from images 430, 430a, and 430b. This distance is within the range of the DOF of first projecting lens 426. Similarly plane 454 is located at a distance from images 442, 442a, and 442b, which is within the range of the DOF of second projecting lens 438. Accordingly if several PSDs were placed at plane 452 or at plane 454, each would measure displacement H of the images corresponding to the displacements h of examined surface 412 according to Eq. (12a):

$$H = a \cdot h + E \qquad \text{Eq. (12a)}$$

Beam 428, after projecting image 430, continues to propagate as beam 456. Beam 440, after producing image 442, continues to propagate as beam 458. Beams 456 and 458 enter inputs 460 and 462 of black boxes 464 and 466 which are similar in their operation to black box 302, in the system of FIG. 4. The interior parts of black box 302 which are shown in the system of FIG. 4, are not shown in black boxes 464 and 466 of FIG. 5 and are replaced by the above symbol $F[C(\gamma), K(d)]$, which represents their functional operation.

Each black box, such as first black box 464, has the following parameters: angle $\gamma = \gamma 1$ and displacement distance d=d1. Accordingly its operator is marked $F[C(\gamma 1), K(d1)]$. Similarly black box 466, the second black box, has the following parameters: angle $\gamma = \gamma 2$ and displacement distance d=d2. Thus its operator is marked $F[C(\gamma 2), K(d2)]$. The optical lenses and PSDs in boxes 464 and 466 are of the type that specified above and are also available from Mells Griot and Hamamatsu, respectively. Theses components and boxes 464 and 466, which contain similar components, are mechanically integrated with the other parts of the present system by commonly used opto-mechanics holders that are also available from Mells Griot, Edmond Scientific Co. of Barrington, N.J., and Newport Co. of Fountain Valley, Calif.

Black box 464 affects only coefficient a in Eq. (12a) by a factor $C(\gamma 1)$ and affects only drawback error E in Eq. (12a) by a factor $K(d1)$ which is different from $C(\gamma 1)$. Their mathematical expression is given by Eqs. (19) and (20b). Similarly black box 466 affects only coefficient a in Eq. (12a) by a factor $C(\gamma 2)$ and affects only drawback error E in Eq. (12a) by a factor $K(d2)$. $C(\gamma 2)$ and $K(d2)$ are different from each other and are different from $C(\gamma 1)$ and $K(d1)$. Their mathematical expression is also given by Eqs. (19) and (20b).

Accordingly, as explained above, first black box 464 will develop an electrical signal at its outputs 468 and 470 that is proportional to H1 when H1 is given according to Eq. (21):

$$H1 = C(\gamma 1) \cdot a \cdot h + K(d1) \cdot E \qquad \text{Eq. (22)}$$

Or:

$$H1 = A \cdot h + E1 \qquad \text{Eq. (22a)}$$

When $A = C(\gamma 1) \cdot a$ and $E1 = K(d1) \cdot E$.

Similarly second black box 466 will develop an electrical signal at its outputs 472 and 474 that is proportional to H2 when H2 is also given according to Eq. (21):

$$H2 = C(\gamma 2) \cdot a \cdot h + K(d2) \cdot E \qquad \text{Eq. (23)}$$

Or:

$$H2 = B \cdot h + E2 \qquad \text{Eq. (23a)}$$

when $B = C(\gamma 2) \cdot a$ and $E2 = K(d2) \cdot E$.

In a situation when $A/B \neq E2/E1$, Eqs, (23) and (23a) are independent equations.

The values of the coefficients A and B can be easily derived from Eqs. (22a) and (23a) by measuring the values of H1 and H2 at outputs 468 and 470, and 472 and 474 when displacement h of examined surface 412 is known and examined surface 412 is a mirrorlike surface at which E1 and E2 equal zero. The ratio R=E1/E2 is given by:

$$R = E1/E2 = K(d1) \cdot E/K(d2) \cdot E = K(d1)/K(d2) \qquad \text{Eq. (24)}$$

R can also be derived easily from Eqs. (22a) and (23a) by measuring the values of H1 and H2 at outputs 468 and 470, and 472 and 474 when displacement h of examined surface 412 is zero and examined surface 412 is a patterned surface, which produces drawback errors E1 and E2.

In this situation A, B, and R are known and equations (22a), (23a), and (24) create a set of three independent equations having three unknowns E1, E2, and h which can be derived accurately. The derived value h indicates the desired value of the distance of examined surface 412 from reference plane 414.

After experimentally deriving the value of A, B, and R as explained above, the electrical signals developed at outputs 468 and 470 and 472 and 474 of first and second black boxes 464 and 466, which are proportional to H1 and H2, respectively, are fed into a Processing Unit (PU) 476.

Since A, B, and R are known, PU 476 solves Eq. (22a) and (23a) and derives accurately the desired values of E1 and E2, and especially the value of h that indicates the desired distance of examined surface 412 from reference plane 414.

Stability of System of FIG. 5

All is required for the system of FIG. 5 to operate properly for measuring the distance of an examined surface from a reference plane, even when the examined surface is a patterned surface, is that Eqs. (22a) and (23a) be independent. This means that distances d1 and d2 will differ from each other and that angles $\gamma 1$ and $\gamma 2$ will differ from each other.

When d1 is much greater than d2 and $\gamma 2$ is much greater than $\gamma 1$, the usual misalignments cannot cause d1 to equal d2 and $\gamma 2$ to equal $\gamma 1$. In case some misalignments do occur and d1 still differs from d2 and $\gamma 2$ stil differs from $\gamma 1$ as well, and the system of FIG. 5 can continue to operate properly without the need for realignment of its optical components. All that is needed is to do two calibrations of the system. The first is a calibration of the value of the proportional coefficient R between drawback errors E1 and E2. This calibration is done by a short measurement as explained above.

The second is a calibration of the values of the coefficients A and B, which is also done easily by a short measurement as explained and described above. It is clear that both of the above calibrations are not associated with any realignment of the optical components of the system of FIG. 5. This makes the above system extremely stable and insensitive to misalignments of its optical components.

The high stability of the present system in comparison to the system of the above reissue patent can also be explained as follows:

The present system is capable of operating properly for an infinite range of values of its parameter sets. In case that some misalignment of the optical components of the system occur, the present system simply moves from the values of one parameter set to the values of another parameter set in which it also operates properly. Accordingly the present system is insensitive to the alignment of its optical components. On the other hand the system of the above reissue patent is capable of operating properly only for the values of a single parameter set, for which the system is designed. Any misalignment that shifts that system out of the values of this parameter set will cause improper operation of that system. Accordingly it is clear that the system of the above reissue patent is much more sensitive to misalignment of its optical components than the present system.

Accuracy of Measurement in System of FIG. 5

The value of the distance h of the examined surface from a reference plane is derived from Eqs. (22a), (23a), and (24) after deriving the drawback error E2 (or E1=R·E2), which is given by:

$$E2 = (H1 - m \cdot H2)/(R - m) \qquad \text{Eq. (25)}$$

where m is the ratio A/B

The maximum error $\Delta E2$ in deriving E2 is given by:

$$\Delta E2 = (\Delta H1 + m \cdot \Delta H2)/(K - m) \qquad \text{Eq. (26)}$$

$\Delta H1$ and $\Delta H2$ are the measurements errors of H1 and H2. From Eq. (26) it is clear that error $\Delta E2$ goes down with increasing R and a decreasing m. A large R and small m will assure a small error $\Delta E2$ (or $\Delta E1 = R \cdot \Delta E2$) and will provide an accurate derivation of the desired value of h with small error $\Delta h$. Accordingly, for achieving small $\Delta h$ it is beneficial to use a large value for distance d1 and a small value for distance d2 for producing a large value of R. It would be also beneficial to use a small angle γ1 and a large angle γ2 for producing small m.

The following set of equations (22a) and (23a) apply to the present invention:

$$H1 = A \cdot h + E1 \quad \text{Eq. (22a)}$$

$$H2 = B \cdot h + E2 \quad \text{Eq. (23a)}$$

There are no requirements for the values of the coefficients A or B, except for the specific situation when A or B equals zero which are excluded from the present system. In this case when A or B equals zero, the present system is reduced from its general form to coincide with the limited and specific form of the system described in the above reissue patent.

Since in the system of the above reissue patent one of the coefficients A or B MUST be exactly zero, then angle γ1 or γ2 MUST be exactly zero. The requirement for maintaining γ1 or γ2 at a value that is precisely zero makes the system sensitive to the alignment of its optical components and thus produces instability. The present system, unlike the system of the above reissue patent, has no requirements for the values of A, B or R and thus has no requirements for the values of γ1, γ2, d1 or d1. The lack of requirements for the values of γ1, γ2, d1 or d1 makes the present system insensitive to the alignment of its optical components and, unlike the system of the above reissue patent it is extremely stable.

Figure 6:
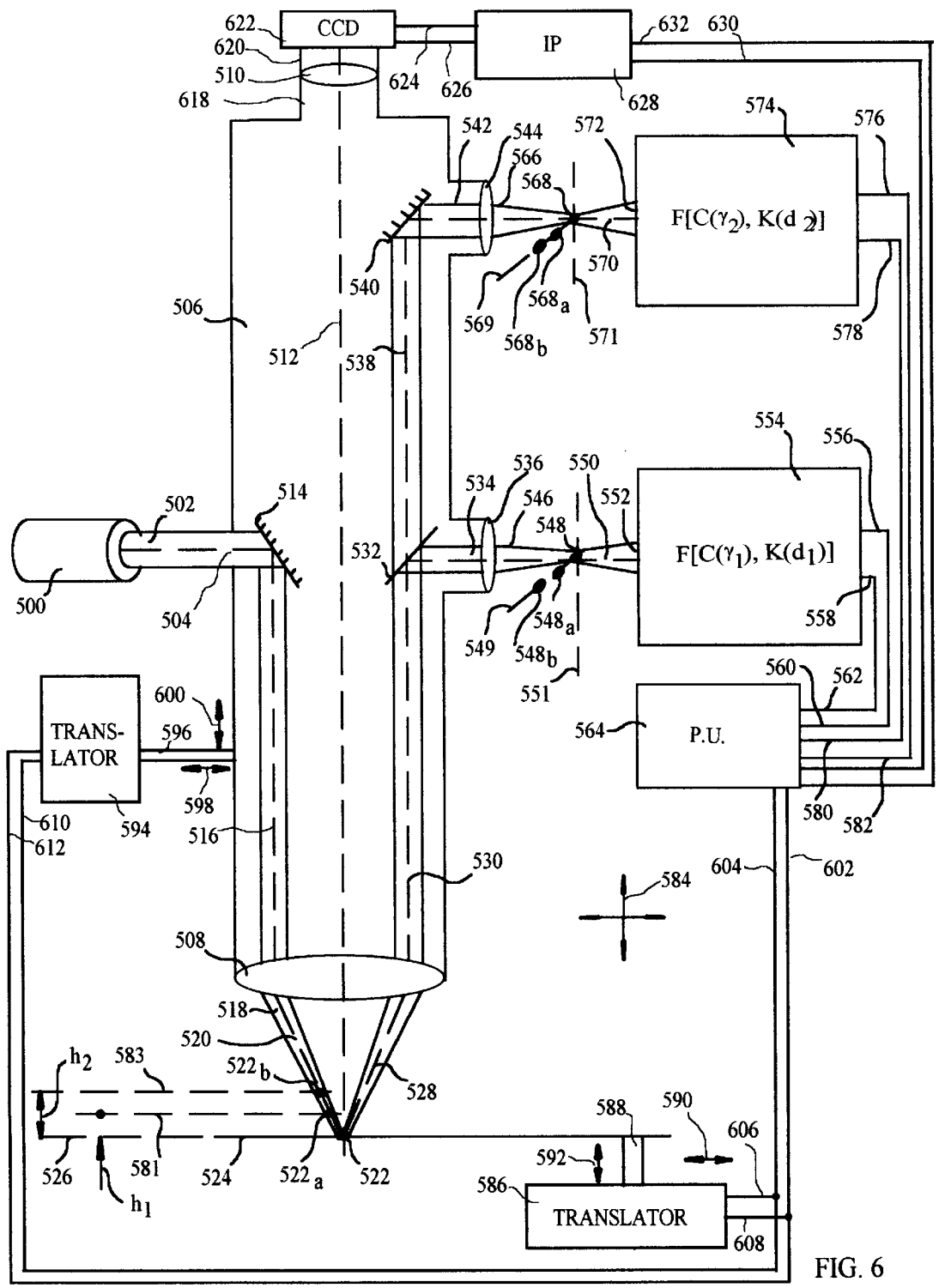
FIG. 6 shows a distance measurement-system according to the present invention in a "through-the-lens" configuration.

FIG. 6—Distance Measurement System in Using Through-The-Lens Configuration—Third Preferred Embodiment FIG. 6 shows another distance measurement system according to the present invention. Unlike the systems of FIGS. 1, 3, 4, and 5, which are standalone systems for measuring distances from reference planes, the system of FIG. 6 is an integral part of another instrument and is used for measuring the working distance of the instrument with which it is integrated. The system designed to measure the distance of an examined surface from a reference plane in a configuration known as "through the lens". In this configuration measuring the working distance (focal length) of another instrument (such as a microscope) is done through the objective lens of the instrument. In this structure the objective lens of the instrument is also a part of the system, so it serves two purposes, projecting and collecting the radiation onto and from the examined surface. Measuring the distance in a through-the-lens technique has the advantage that the distance is measured relative to the objective lens, which is the reference point of the whole system. Accordingly, unlike instruments having separated systems for measuring their working distance, which might suffer from relative shifts between them and their distance measurement systems, the through-the-lens configuration has no relative shifts between the distance measurement system and the instrument for which the measurement is done.

Radiation source 500 emits parallel beam 502 into an opening 504 of microscope 506 having objective lens 508 and eyepiece lens 510 having a common optical axis 512. Beam 502 is reflected by mirror 514 as parallel beam 516 that propagates toward objective lens 508. Beam 516 is converted by objective lens 508 into focussing beam 518 having optical axis 520. Focussing beam 520 is focussed to project radiation spot 522 on examined surface 524 located at reference plane 526. Beam 518 is reflected from examined surface 524 as diverging reflected beam 528 and is collected by objective lens 508 that converts it into parallel reflected beam 530.

Part of reflected beam 530 is reflected by beam-splitter 532 as parallel beam 534 that propagates toward lens 536. The other part of beam 530 propagates through beam-splitter 532 as beam 538 and is reflected by mirror 540 as beam 542 that propagates toward lens 544.

Beam 534 is converted by lens 536 into beam 546 that is focused to project image 548 of examined surface 524 under radiation spot 522. From image 548 beam 546 continues to propagate as beam 550 that enters input 552 of black box 554 (similar to boxes 464 and 466) which performs the operating function F[C(γ1), K(d1)]. Outputs 556 and 558 of black box 554 are fed into inputs 560 and 562 of PU 564. PU 564 can be an electrical unit that serves as a mathematical processor for producing mathematical calculations to derive the position of examined surface 524 from the values of the currents exist in outputs 556, 558, 576, and 578 of boxes 564 and 574. For example, PU 564 can be a microprocessor or an Application Specific Integrated Circuit (ASIC). For example, such ASICs are produced by ES2 Company in France or by AMS Company in Austria. PU 564 can be also a personal computer, such as those available from IBM in U.S.A which runs calculation programs such as Basic, Qbasic, C, or C++.

Beam 542 is converted by lens 544 into focussing beam 566 that is focused to project image 568 of examined surface 524 under radiation spot 522. From image 568 beam 566 continues to propagate as beam 570 that enters input 572 of black box 574 (similar to box 554) which performs the operating function F[C(γ2), K(d2)]. Outputs 576 and 578 of black box 574 are fed into inputs 580 and 582 of PU 564.

Lines 549 and 569 are virtual line images of optical axis 520 and they would be real images of axis 520 if axis 520 were a real object. Images 548, 548a, and 548b are distributed along line 549 and correspond to the objects of examined surface 524 under radiation spots 522, 522a, and 522b, respectively. Similarly images 568, 568a, and 568b are distributed along line 569 and correspond to the objects of examined surface 524 under radiation spots 522, 522a, and 522b, respectively. Radiation spots 522, 522a, and 522b are the spots projected by focussing beam 518 onto examined surface 524 and each corresponds to one of the positions of surface 524 when it is positioned at reference plane 526 and planes 581 and 583. Planes 581 and 583 indicate the locations of first and second position of examined surface 524 and thus the values of their displacement h from reference plane 526 are h1 and h2, respectively.

FIG. 6—Operation of the System

The operation of the system of FIG. 6 is very similar to that of the system of FIG. 5. It differs from FIG. 5 mainly in the way that the radiation is projected and collected onto and out from the examined surface. In FIG.5 the radiation is projected onto the examined surface by one lens (first focussing lens 404) and is collected from the examined surface by another lens (first collecting lens 418). In FIG. 6 the radiation is projected on examined surface 524 and is collected from examined surface by the same lens, which is the microscope objective lens 508.

Plane 551 is located at the vicinity of images 548, 548a, and 548b at a distance which is within the range of depth of focus (DOF) of lens 536. Similarly plane 571 is located at the vicinity of images 568, 568a, and 568b at a distance which is within the range of DOF of lens 544.

According to the explanation above, the relationships between the displacement h of examined surface 524 and the displacements H of images such as 548a and 548b, and 568a and 568b is given by Eq.(12a) below. In this case such displacements would be measured by PSDs (if such PSDs were be placed at planes 551 and 571):

$$H = a \cdot h + E \qquad \text{Eq. (12a)}$$

Black box 554 affects only coefficient a in Eq. (12a) by a factor C(γ1) and affects only drawback error E in Eq. (12a) by a factor K(d1). These are different from each other and their mathematical expression is given by Eqs. (19) and (20b). Similarly black box 574 affects only coefficient a in Eq. (12a) by a factor C(γ2) and affects only drawback error E in Eq. (12a) by a factor K(d2). C(γ2) and K(d2) differ from each other and differ from C(γ1) and K(d1). The mathematical expression for C(γ1) and K(d1) is also given by Eqs. (19) and (20b).

Accordingly, as explained above, black box 554 will develop an electrical signal at its outputs 556 and 558 that is proportional to HI when Hi is given according to Eq. (21):

$$H1 = C(\gamma 1) \cdot a \cdot h + K(d1) \cdot E \qquad \text{Eq. (22)}$$

Or:

$$H1 = A \cdot h + E1 \qquad \text{Eq. (22a)}$$

where $A = C(\gamma 1) \cdot a$ and $E1 = K(d1) \cdot E$.

Similarly, black box 574 will develop an electrical signal at its outputs 576 and 578 that is proportional to H2 when H2 is also given according to Eq. (21):

$$H2 = C(\gamma 2) \cdot a \cdot h + K(d2) \cdot E \qquad \text{Eq. (23)}$$

Or:

$$H2 = B \cdot h + E2 \qquad \text{Eq. (23a)}$$

when $B = C(\gamma 2) \cdot a$ and $E2 = K(d2) \cdot E$.

The values of coefficients A and B can be easily derived from Eqs. (22a) and (23a) by measuring the values of H1 and H2 at outputs 556 and 558, and 576 and 578 when displacement h of examined surface 524 is known and examined surface 524 is a mirrorlike surface at which E1 and E2 equal zero. The ratio R=E1/E2 is given by:

$$R = E1/E2 = K(d1) \cdot E / K(d2) \cdot E = K(d1)/K(d2) \qquad \text{Eq. (24)}$$

R can also be derived easily from Eqs. (22a) and (23a) by measuring the values of H1 and H2 at outputs 556 and 558, and 576 and 578, when displacement h of examined surface 524 is zero and examined surface 524 is a patterned surface, which produces drawback errors E1 and E2.

In this situation A, B, and R are known and equations (22a), (23a), and (24) create a set of three independent equations having three unknowns E1, E2, and h, which can be derived accurately. The derived value of h indicates the desired value of the distance of examined surface 524 from reference plane 526.

After experimentally deriving the value of A, B and R, the electrical signals developed at outputs 556 and 558, and 576 and 578 of black boxes 554 and 574, which are proportional to H1 and H2, respectively, are fed into a PU 564.

Since A, B, and R, are known, PU 564 solves Eqs. (22a), (23a), and (24) and derives accurately the desired values of E1 and E2, especially the value of h that indicates the distance of examined surface 524 from reference plane 526.

The distance measurement system of FIG. 6 can be operated as a profiler or profilometer when relative movement 584 is introduced between microscope 506 and examined surface 524. Relative movement 584 causes spot 522 to translate along examined surface 524. The present distance measurement system does not required a nulling process to perform the distance measurements and thus the measurements are conducted at a very high speed. The high rate in which the measurements can be done allows the measurements to be performed with the flying spot technique, i.e., while spot 522 translates along surface 524. Accordingly the combination of high rate distance measurements with a translation of spot 522 along surface 524 enables the surface profile and topography to be obtained.

Relative movement 584 is produced by translator 586, or by translator 594, or by both of them. Translator 586 is having movable arm 588 that its movement is controlled by P.U. 564. The controlled movement of arm 588 with surface 524 on top of it causes the controlled movement of this surface along the (X,Y) plane which is indicated by arrows 590. PU 564 generates electrical control signals at its outputs 602 and 604. These control signals are fed to inputs 606 and 608 of translator 586 to control the movement of its arm 588 and thus to control the movement of surface 524.

Similarly, relative movement 584 can also be produced by translator 594. Translator 594 has a movable arm 596 whose movement is controlled by PU 564. The controlled movement of arm 596 with microscope 506 mounted on it causes the controlled movement of this microscope along the (X,Y) plane, which is indicated by arrows 598. PU 564 generates electrical signals at its outputs 602 and 604. These control signals are fed to inputs 610 and 612 of translator 594 to control the movement of its arm 596 and thus control the movement of microscope 506.

Accordingly it is clear that relative movement 584 between microscope 506 and surface 524 along (X,Y) plane can be produced either when arm 588 moves along the arrows 590 and arm 596 is in a static position or when arm 596 moves along arrows 598 and arm 588 is in a static position. When translators 586 and 594 move at different velocities along the direction of arrows 590 and 598, respectively, then they can be operated together and still maintain controlled relative movement 584 between surface 524 and microscope 506 along the (X,Y) plane. Translators 586 and 594 are also capable of moving up and down along the Z direction (normal to the (X,Y) plane), as illustrated by arrows 592 and 600, respectively. The Z motion is also controlled by PU 564 at a way similar to that in which the (X,Y) motion is controlled.

As previously explained, the value of the measured distance between objective lens 508 and surface 524 is derived at PU 564, which is also capable of controlling this distance by the up and down movements of translators 586 and 594, which move surface 524 and microscope 506 along the Z axis. Accordingly it is clear that the WD of objective lens 508 can be maintained fixed by the closed loop control that includes the distance measurement system and translators 586 and 594 that are controlled by PU 564. The additional closed loop for controlling the WD for maintaining it fixed converts the distance measurement system into an autofocus system. For example, such an autofocus system is needed in inspection machines used to inspect wafers for the IC industry. These inspection machines can be based on optical system, such as the inspection system for ICs wafers or printed circuit boards (PCB) which are made by Orbot Instruments and Camtek in Israel. Alternatively these inspection machines can be based on a Scanning Electron Microscope (SEM), such as the Scanning Electron Microscope—Critical Dimensions (SEM-CD) produced by Opal in Israel.

Translators 586 and 594 can be of motorized translators such as those produced and sold by Newport Corporation, P.O. Box 8020, 18235 Mt. Baldy Circle, Fountain Valley, Calif. 92728-8020. These translators have repeatability and accuracy of 0.1 μm and a traveling range of several cm. In case better accuracy is needed, translators 586 and 594 can be of the type which includes piezoelectric crystals for motion. Such piezoelectric translators are available from Nanomotion Co., located at Industrial Zone, Yokneam, Israel.

All the preferred embodiments described above are used for measuring absolute distances from a reference plane without the need for a nulling process. Without the nulling process there is no need for the relative up-and-down movement between the distance measurement system and the examined surface, resulting in extremely fast measurements. The fast measurement allows the present systems to be operated using the flying spot technique. In the flying spot technique, the distance of the examined surface from a reference plane is measured while the radiation spot projected onto the examined surface translates on it due to relative movement between the distance measurement system and the examined surface. Such relative movement is schematically illustrated by arrow 584 of FIG. 6. Accordingly, when relative movement in a direction perpendicular to the direction of the measured distance is introduced between the present systems and the measured surface, such systems can be used as profilers or profilometers for measuring the contours and topography of the examined surface.

Charge Coupling Device camera (CCD) 622 is integrated with Microscope 506. Camera 622 and mounting tube 618 of eyepiece 510 are mechanically connected using a standard mounting component 620 such as a C mount. Eyepiece lens 510 serves as an objective lens for camera 622. Leads 624 and 626 electrically connect Camera 622 and Image Processing Unit (IP) 628. Leads 630 and 632 electrically connect IP 628 and PU 564.

For example, camera 622 can be implemented by using a CCD camera model XC-003/003P produced by Sony and distributed by Subtechnique, Inc. located at 4950-C Eisenhower Avenue, Alexandria, Va. 22304. Unit IP 628 can be implemented by using image processing unit PVC 512 KMII produced by Vision Dynamics Ltd. Located at 1 St. Albans Road, Hemel Hempstead, Herts. HP24XX, United Kingdom.

Camera 622 converts the optical image of surface 524 into electrical signals transferred by leads 624 and 626 to IP 628 for processing. Processing by IP 628 include inspection and producing of controlling signals according to predefined situations. Leads 630 and 632 transfer the controlling signals from IP 628 to PU 564. PU 564 converts the controlling signals into movement commands that leads 606, 608, 610, and 612 pass to translators 586 and 594.

The movement commands cause translators 586 and 594 to move along (X, Y, Z) directions and to positioning surface 524 at the desired location. The system of FIG. 6 presents a fully automated optical inspection machine. This inspection machine also incorporates a distance measurement system. This distance measurement system controls and maintains a working distance between objective lens 508 and surface 524. This distance measurement system assures that the working distance be maintained and be equal to the depth of the focus of lens 508.

Such inspection machines are commonly used in the IC industry where surface 524 is a surface of a silicon wafer. The system of FIG. 6 is also suitable to measure and/or control the location of the surface 524 to maintain working distances of current machine equal to the working distances of another additional inspection machine. For example the additional inspection machine/system can be a scanning electron microscope—critical dimension type.

Summary, Ramifications, and Scope

This it is seen that we have provided an improved system for measuring surface distances from a reference plane which has improved stability and operates without the nulling process. We also have provided a method and apparatus for accurately measuring the distance of an examined patterned surface from a reference plane in which the sensitivity to the instability of their optical components is reduced. Additional advantages that we have provided are a method and apparatus which can operate properly for a long time, in spite of some misalignments that might occur in a typical environment, related to the field of the invention. Further advantages that we have provided can be seen in the description and accompanying drawings.

While the invention has been described with respect to several preferred embodiments, it will be appreciated that they are set forth purely for purposes of example, and that many other variations, modifications and applications of the invention may be made. For example, while the invention has been described with respect to a semiconductor application, it will be appreciated that it can advantageously be used in many other applications as well. For example, the present system can be used as a distance measurement system or as an Auto Focus Subsystem (AFS) in inspection machines. The AFS is needed for controlling the working distance between the examined surface and the objective lens of those inspection machines to maintain it equal to the focal length of their objective lens for achieving the possible best resolution. Such inspection machines are commonly used for on line production control and also for quality control in the fields of optical inspection, Scanning Electron Microscopes—Critical Dimension (SEM-CD), mask projectors (steppers), Compact Disk (CD) players, CD ROMs, computer disks, video disks, Printed Circuit Boards (PCBs), electronic components, laser writing and reading, Electron Beam (EB) writing, parts assembly, and other machinery. The system can also be operated as a standalone system. For example, it can be used as a profiler for measuring surface contours and topography when a relative movement (such as relative movement 584 of FIG. 6) is introduced in the (X, Y) plane between this system (microscope 506) and the examined surface (524).

Therefore the scope of the invention should be determined only by the appended claims and their legal equivalents, and not by the specifics given.

What is claimed is:

1. Apparatus for measuring the distance of an examined surface from a reference plane, comprising:

(a) a first radiation detector;

(b) a second radiation detector;

(c) at least one optical component for directing a radiation beam along a first optical path;

(d) said first optical path including first focussing means for focussing said radiation beam as a spot on said examined surface so that it is reflected therefrom as reflected radiation;

(e) at least one optical component for collecting and converting said reflected radiation to a reflected beam;

(f) at least one optical component for directing a part of said reflected beam through a second optical path;

(g) said second optical path including second focussing means for focussing said part of said reflected beam onto a first spot on a surface of said first detector;

(h) said first detector being located such that the position of said first spot on said first detector corresponds to the distance of said examined surface under said spot from said reference plane and is expressed by a first mathematical equation which includes two terms;
   (i) a first drawback error caused by variations in optical properties in said examined surface;
   (ii) a first surface displacement, representing the distance between said examined surface under said spot and said reference plane;
(i) at least one optical component for directing another part of said reflected beam through a third optical path;
(j) said third optical path including third focussing means for focussing said other part of said reflected beam onto a second spot on a surface of said second detector;
(k) said second detector being located such that the position of said second spot on said second detector corresponds to the distance of said examined surface under said spot from said reference plane and is expressed by a second mathematical equation which includes two terms:
   (i) a second drawback error caused by variations in optical properties in said examined surface; and
   (ii) a second surface displacement, representing the distance between said examined surface under said spot and said reference plane;
(l) said second and third focussing means being arranged to cause said first and second mathematical equations to be independent equations; and
(m) a processing unit for utilizing the outputs of said first and second detectors for providing a measurement of the distance of said examined surface under said radiation spot from said reference plane.

2. The system of claim 1, further including at least one translator for changing the relative position between said examined surface and said spot.

3. The system of claim 2 wherein said translator is arranged to changing said relative position for measuring the topography of said examined surface.

4. The system of claim 1, further including at least one translator for producing relative movement between said examined surface and said spot for measuring the topography of said examined surface.

5. The system of claim 1 wherein said distance between said examined surface and said reference plane is a working distance of an inspection machine.

6. The system of claim 5 wherein said inspection machine is an optical inspection machine for inspecting wafers used in the integrated circuit industry.

7. The system of claim 5 wherein said inspection machine is an optical inspection machine for inspecting printed circuit boards.

8. The system of claim 5 wherein said inspection machine is a scanning electron microscope for inspecting critical dimensions in wafers used in the integrated circuit industry.

9. The system of claim 1 wherein said distance between said examined surface and said reference plane is a working distance of an inspection machine and further including means for maintaining said working distance fixed.

10. The system of claim 9 wherein said inspection machine is an optical inspection machine for inspecting wafers used in the integrated circuit industry.

11. The system of claim 9 wherein said inspection machine is an optical inspection machine for inspecting printed circuit boards.

12. The system of claim 9 wherein said inspection machine is a scanning electron microscope used for inspecting critical dimensions in wafers used in the integrated circuit industry.

13. Apparatus for measuring the distance of an examined surface from a reference plane, comprising:
(a) a first radiation detector;
(b) a second radiation detector;
(c) at least one optical component for directing a radiation beam along a first optical path;
(d) said first optical path including first focussing means for focussing said radiation beam as a spot on said examined surface so that it is reflected therefrom as reflected radiation; said first focussing means arranged to collect and convert said reflected radiation to a reflected beam;
(e) at least one optical component for directing a part of said reflected beam through a second optical path;
(f) said second optical path including second focussing means for focussing said part of said reflected beam onto a first spot on a surface of said first detector;
(g) said first detector being located such that the position of said first spot on said first detector corresponds to the distance of said examined surface under said spot from said reference plane and is expressed by a first mathematical equation which includes two terms:
   (i) a first drawback error caused by variations in optical properties in said examined surface; and
   (ii) a first surface displacement, representing the distance between said examined surface under said spot and said reference plane; and
(h) at least one optical component for directing another part of said reflected beam through a third optical path,
(i) said third optical path including third focussing means for focussing said other part of said reflected beam onto a second spot on a surface of said second detector;
(j) said second detector being located such that the position of said second spot on said second detector corresponds to the distance of examined surface under said spot from said reference plane and is expressed by a second mathematical equation which includes two terms:
   (i) a second drawback error caused by variations in optical properties in said examined surface; and
   (ii) a second surface displacement, representing the distance between said examined surface under said spot and said reference plane;
(k) said first and second focussing means being arranged to cause said first and second mathematical equations to be independent equations; and
(l) a processing unit for utilizing the outputs of said first and second detectors for providing a measurement of the distance of said examined surface under said radiation spot from said reference plane.

14. The system of claim 13 wherein said system includes at least one translator for changing the relative distance between said examined surface and said spot.

15. The system of claim 14 wherein said translator is arranged to change said relative distance for measuring the topography of said examined surface.

16. The system of claim 13 wherein said system includes at least one translator for producing relative movement between said examined surface and said spot for measuring the topography of said examined surface.

17. The system of claim 13 wherein said an examined surface and said reference plane are in an inspection machine and said working distance is the distance between said examined surface and said reference plane.

18. The system of claim 17 wherein said inspection machine is an optical inspection machine for inspecting wafers used in the integrated circuit industry.

19. The system of claim 17 wherein said inspection machine is an optical inspection machine for inspecting printed circuit boards.

20. The system of claim 17 wherein said inspection machine is a scanning electron microscope used for inspecting critical dimensions in wafers used in the integrated circuit industry.

21. The system of claim 13 wherein said distance between said examined surface and said reference plane is a working distance of an inspection machine and further including means for maintaining said working distance fixed.

22. The system of claim 21 wherein said inspection machine is an optical inspection machine for inspecting wafers used in the integrated circuit industry.

23. The system of claim 21 wherein said inspection machine is an optical inspection machine for inspecting printed circuit boards.

24. The system of claim 21 wherein said inspection machine is a scanning electron microscope used for inspecting critical dimensions in wafers used in the integrated circuit industry.

25. The system of claim 13 wherein said first focussing means is an objective lens.

26. A method of measuring the distance of an examined surface from a reference plane, comprising:
   (a) providing first and second radiation detectors;
   (b) directing a radiation beam along first optical path which includes first focussing means for focussing said radiation beam as a spot on said examined surface so that it is reflected therefrom as reflected radiation;
   (c) collecting and convening said reflected radiation to a reflected beam;
   (d) directing a part of said reflected beam through a second optical path including second focussing means for focussing said part of said reflected beam onto a first spot on a surface of said first detector;
   (e) locating said first detector such that the position of said first spot on said first detector corresponds to the distance of said examined surface under said spot from said reference plane and is expressed by a first mathematical equation which includes two terms:
      (i) a first drawback error caused by variations in optical properties in said examined surface; and
      (ii) a first surface displacement, representing the distance between said examined surface under said spot and said reference plane; and
   (f) directing another part of said reflected beam through a third optical path which includes third focussing means for focussing said other part of said reflected beam onto a second spot on a surface of said second detector;
   (g) locating said second detector such that the position of said second spot on said second detector corresponds to the distance of said examined surface under said spot from said reference plane and is expressed by a second mathematical equation which includes two terms:
      (i) a second drawback error caused by variations in optical properties in said examined surface; and
      (ii) a second surface displacement, representing the distance between said examined surface under said spot and said reference plane,
   (h) arranging said second and third focussing means to cause said first and second mathematical equations to be independent equations, and
   (j) utilizing the outputs of said first and second detectors for providing a measurement of the distance of said examined surface under said radiation spot from said reference plane.

27. The method of claim 26 further including changing the relative position between said examined surface and said spot.

28. The method of claim 27, further comprising the relative position for measuring the topography of said examined surface.

29. The method of claim 26 wherein said examined surface and said reference plane represents the working distance of an inspection machine.

30. The method of claim 26, further comprising maintaining said distance fixed and equal to the working distance of an inspection machine.

31. A method of measuring the distance of an examined surface from a reference plane, comprising:
   (a) providing first and second radiation detectors;
   (b) directing a radiation beam along first optical path which includes first focussing means for focussing said radiation beam as a spot on said examined surface so that it is reflected therefrom as reflected radiation, and arranging said first focussing means to collect and convert said reflected radiation to a reflected beam;
   (c) directing a part of said reflected beam through a second optical path which includes second focussing means for focussing said part of said reflected beam onto a first spot on a surface of said first detector;
   (d) locating said first detector such that the position of said first spot on said first detector corresponds to the distance of said examined surface under said spot from said reference plane and is expressed by a first mathematical equation which includes two terms:
      (i) a first drawback error caused by variations in optical properties in said examined surface; and
      (ii) a first surface displacement, representing the distance between said examined surface under said spot and said reference plane;
   (e) directing another part of said reflected beam through a third optical path which includes third focussing means for focussing said other part of said reflected beam onto a second spot on a surface of said second detector;
   (f) locating said second detector such that the position of said second spot on said second detector corresponds to the distance of examined surface under said spot from said reference plane and is expressed by a second mathematical equation which includes two terms:
      (i) a second drawback error caused by variations in optical properties in said examined surface; and
      (ii) a second surface displacement, representing the distance between said examined surface under said spot and said reference plane;
   (g) arranging said first and second focussing means to cause said first and second mathematical equations to be independent equations; and
   (h) utilizing the outputs of said first and second detectors for providing a measurement of the distance of said examined surface under said radiation spot from said reference plane.

32. The method of claim 31, further including changing the relative position between said examined surface and said spot.

33. The method of claim 31, further comprising changing said relative position for measuring the topography of said examined surface.

34. The method of claim 31 wherein said examined surface and said reference plane represent the working distance of an inspection machine.

35. The method of claim 31, further comprising maintaining said distance fixed and equal to the working distance of an inspection machine.

36. The method of claim 31, further comprising arranging said first focussing means to operate also as an objective lens.

\* \* \* \* \*